United States Patent

Henry

Patent Number: 4,763,028
Date of Patent: Aug. 9, 1988

[54] CIRCUIT AND METHOD FOR SEMICONDUCTOR LEAKAGE CURRENT COMPENSATION

[75] Inventor: Paul M. Henry, Tucson, Ariz.

[73] Assignee: Burr-Brown Corporation, Tucson, Ariz.

[21] Appl. No.: 125,785

[22] Filed: Nov. 27, 1987

Related U.S. Application Data

[63] Continuation of Ser. No. 784,575, Oct. 4, 1985, abandoned, which is a continuation-in-part of Ser. No. 294,844, Aug. 21, 1981, abandoned.

[51] Int. Cl.[4] .................. H03F 3/45; H03K 17/10; H03K 17/687; H03K 19/003
[52] U.S. Cl. .................... 307/573; 307/304; 307/310; 307/572; 307/570; 307/491; 307/497; 307/501; 330/253; 330/256
[58] Field of Search ............ 307/491, 497, 501, 571, 307/572, 304, 310, 475, 573, 570; 330/256, 277, 253; 357/36

[56] References Cited

U.S. PATENT DOCUMENTS

| | | | |
|---|---|---|---|
| 3,622,902 | 11/1971 | Thomas | 330/256 X |
| 3,772,607 | 11/1973 | Luckett et al. | 307/475 |
| 3,947,778 | 3/1976 | Hsiao et al. | 330/253 |
| 4,048,575 | 9/1977 | Musa | 330/253 |
| 4,068,254 | 1/1978 | Erdi | 357/36 X |
| 4,472,648 | 9/1984 | Prentice | 330/253 X |
| 4,598,253 | 7/1986 | Reindel et al. | 330/253 |
| 4,639,683 | 1/1987 | Counts et al. | 330/253 |

OTHER PUBLICATIONS

Marty, "BiFET/Trim FET Operational Amplifiers", Electronic Engineering, vol. 52, No. 639, pp. 109–111, 121, 125–127, Jun. 1980.
Cate, "Composite op amp outperforms FET-input IC", EDN, vol. 26, No. 11, pp. 151–153, May 27, 1981.
Hamilton, *Handbook of Linear Integrated Electronics for Research*, pp. 49–50 and 188–190, McGraw-Hill Book Co., 1977.

*Primary Examiner*—Stanley D. Miller
*Assistant Examiner*—David R. Bertelson
*Attorney, Agent, or Firm*—Harry M. Weiss & Assoc.

[57] ABSTRACT

Circuitry and method for compensating for the junction leakage current of a reverse-biased semiconductor device. Compensation is effected by trimming the leakage of a compensating device at a high temperature in order to accurately compensate the leakage current over a broad range of temperatures. Potential applications include reduction of the input bias current of an amplifier or differential amplifier.

20 Claims, 2 Drawing Sheets

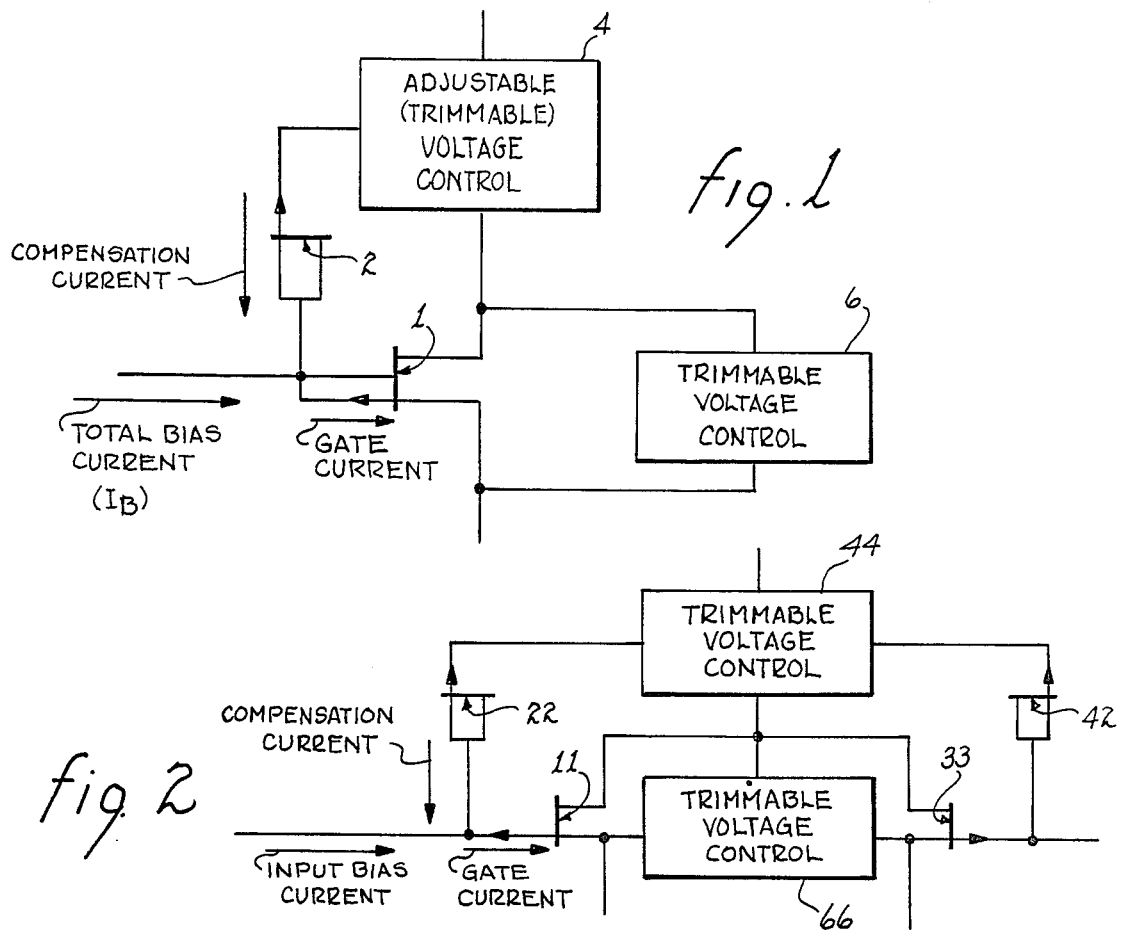
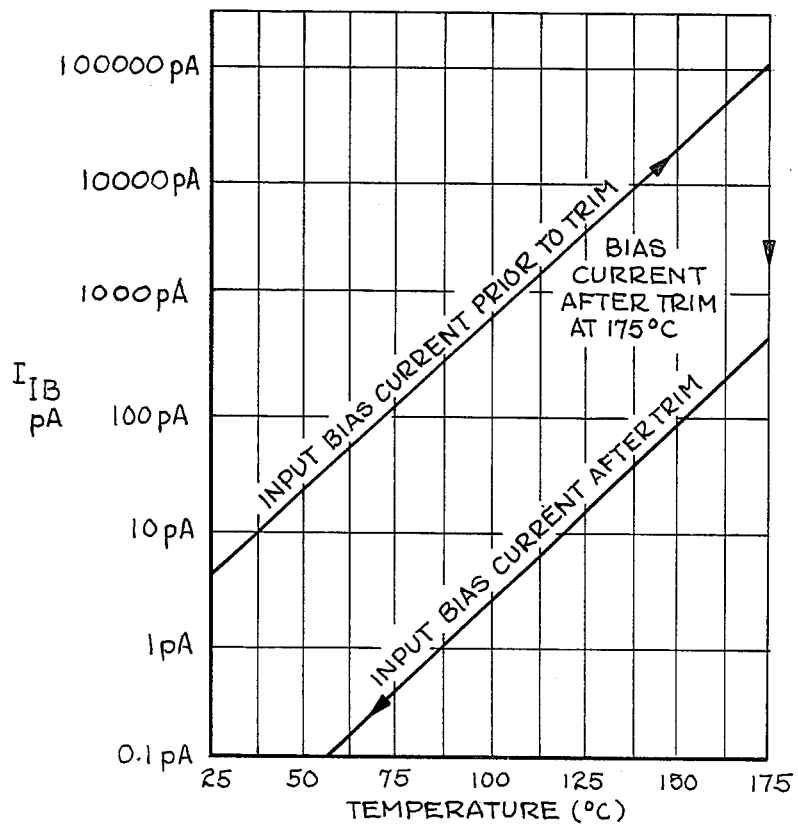

CIRCUIT AND METHOD FOR SEMICONDUCTOR LEAKAGE CURRENT COMPENSATION

This is a continuation of co-pending application Ser. No. 784,575 filed on Oct. 4, 1985, which is a continuation-in-part of Ser. No. 294,844 filed Aug. 21, 1981, now abandoned.

BACKGROUND OF THE INVENTION

1. Field of the Invention

This invention relates generally to improved circuit configuration and methods for compensating for the junction leakage current of a semiconductor device and, more specifically, to a method and circuitry for compensating for the gate leakage current of junction field effect transistors.

2. Description of the Prior Art

With the advent of semiconductor devices, sophisticated electronic functions have been provided at extremely low cost. One of the major contributing factors to reducing cost is the ability to test and/or trim such devices before final assembly. Trimming enhances performance; pre-assembly testing eliminates defective or low-performance devices before additional costs are incurred.

A major reason for the utilization of the junction field effect transistor (JFET) is its very low input current, which arises from the reverse-bias junction leakage current of the gate which controls the output current of the device. This is in contradiction to a bipolar transistor, whose base input is forward biased at a current value which may be appreciable if the low current gain of the device is poor. This is a commonplace manufacturing problem involving cost-yield tradeoffs. By contrast, for JFETs the reverse-bias junction leakage can be made and maintained at an extremely low current value. Room temperature current values of one picoampere are routine in a JFET and even lower current values may be achieved.

A pronounced problem, however, is engendered in any reverse-bias JFET during higher temperature operation due to the doubling of leakage current for about every 10° C. rise in temperature. Thus, the leakage at 0° C. for reverse-biased JFETs becomes approximately 5700 times greater at 125° C., for example.

While this dramatic increase in leakage current for reverse-biased junction type semiconductor devices is usually somewhat less troublesome in differential amplifier configurations, the mismatch in the input device leakage currents is similarly exacerbated by temperature rise, i.e. a 10% leakage mismatch between input devices having nominal one picoampere current leakage at 0° C. will become a current leakage mismatch of almost 1 nanoampere at 125° C.

In the past, it has been commonplace to reduce current leakage mismatch between JFETs over temperature by a priori compensation schemes, such as the use of a second reverse-biased JFET to compensate for the leakage of the input device or devices. This type of approach suffers from the same general problem as described above, viz, it is difficult to manufacture two reverse-biased JFETs with the same leakage current. Also known are various a posteriori compensation schemes, such as trimming active and/or concomitant passive devices (e.g. load elements) on the basis of measured current leakage values subsequent to initial fabrication, but prior to final device packaging. However, current wafer probe measurement techniques cannot accurately measure, and hence appropriately compensate for, leakage currents or leakage current mismatches on the order of 100 picoamperes or less. The ambient electrical noise and ambient light both contribute to this current leakage mensuration problem. Thus, a need exists for improved leakage current compensation techniques for small currents in reverse-biased JFETs such as junction leakage currents.

SUMMARY OF THE INVENTION

It is an object of this invention to provide an apparatus, circuit and method for substantially reducing the magnitude and variation of undesired leakage currents in semiconductor devices and integrated circuits.

It is yet an additional object of this invention to reduce the magnitude and temperature variation of undesired leakage currents arising from reverse-biased JFETs and integrated circuits.

It is a further object of this invention to reduce the magnitude and temperature variation of undesired leakage currents arising from the gate leakage current of a junction field effect transistor or multiple JFET transistors.

It is yet another object of this invention to provide a method for trimming a current supply means in order to compensate for leakage currents at elevated temperatures, whereby undesired offset and/or leakage currents over a temperature range are reduced.

It is still a further object of this invention to provide a method for achieving accurate temperature-tracking of two semiconductor device currents which currents increase with temperature.

DESCRIPTION OF THE PREFERRED EMBODIMENTS

In accordance with one embodiment of this invention, a semiconductor circuit is disclosed for operation over a range of temperatures. The circuit comprises a first JFET having a low room temperature leakage current and a larger higher temperature leakage current, a second JFET having temperature-sensitive leakage current characteristics similar to the first JFET and electrically connected to the first JFET to provide current source means to provide a variable source of current of the first JFET, and at least one trimmable resistor network electrically connected to both the first and second JFETs and adjusted at a higher temperature than room temperature for substantially matching the leakage current of the first and second JFETs. The disclosed circuit includes a variable current source for compensating temperature-sensitive leakage currents in a semiconductor device. Where the current source means is voltage responsive, both the first and second JFET currents are measured at a temperature where leakage currents are larger, and the voltage to the gate of the second JFET is adjusted by trimming the variable resistance network to achieve minimum leakage current through the first JFET.

In accordance with another embodiment of this invention, a semiconductor circuit is disclosed for operation as a differential amplifier with low input bias current over a wide range of temperatures. The circuit comprises first and second JFETs, configured for voltage gain, having low room temperature input leakage currents and larger higher temperature input leakage currents, first and second JFETs for compensation purposes having temperature-sensitive leakage current characteristics similar to the first and second input JFETs, the first and second the drain and source of each compensation JFET is electrically connected to a gate of the first or second input JFET, respectively, to supply at least a portion of the input leakage currents of the first and second input JFETs, and at least one variable resistance network electrically connected to the gates of the first and second compensation JFETs and to the drains of the first and second input JFETs. The the value of the variable resistance network is adjusted at a temperature higher than room temperature to provide current source means to substantially match the leakage currents of the first and second input JFETs and the first and second compensation JFETs to reduce the effective input bias current over a range of temperatures. The disclosed circuit or apparatus includes two integral voltage-sensitive trimmable compensation JFETs for compensating temperature-sensitive trimmable currents in interconnected JFETs. The compensation JFET currents and the input JFETs currents are measured at a temperature where the compensation currents are large, and the the value of the variable resistance network is adjusted by trimming for best compensation.

In accordance with another embodiment of this invention, a method is disclosed for reducing the effective leakage current of a JFET over a broad range of temperatures. The method comprises the steps of: connecting a second JFET having temperature-sensitive leakage similar to the first JFET to supply at least a portion of the leakage of the first JFET; and adjusting the value of a variable resistance network coupled to the first JFET and the compensation JFET at a higher than room temperature to match the leakage of the device and the semiconductor means at the high temperature to reduce the effective leakage current of the first JFET over the broad range of temperatures.

The foregoing and other objects, features and advantages of this invention will be apparent from the following more particular description of the preferred embodiments of the invention as illustrated in the accompanying drawings.

BRIEF DESCRIPTION OF THE DRAWINGS

FIG. 1 is a schematic representation of a circuit in accordance with this invention which may be used to compensate for a JFET's leakage current by trimming.

FIG. 2 is a schematic representation of another circuit in accordance with this invention that is used for compensating for the junction leakage currents in two JFETs suitable for use in a differential input configuration.

FIG. 3 is a graph showing the input bias current (ordinate) versus temperature (abscissa) for the circuit of FIG. 1 before and after compensation trimming.

THE SPECIFICATION

Figure 4:
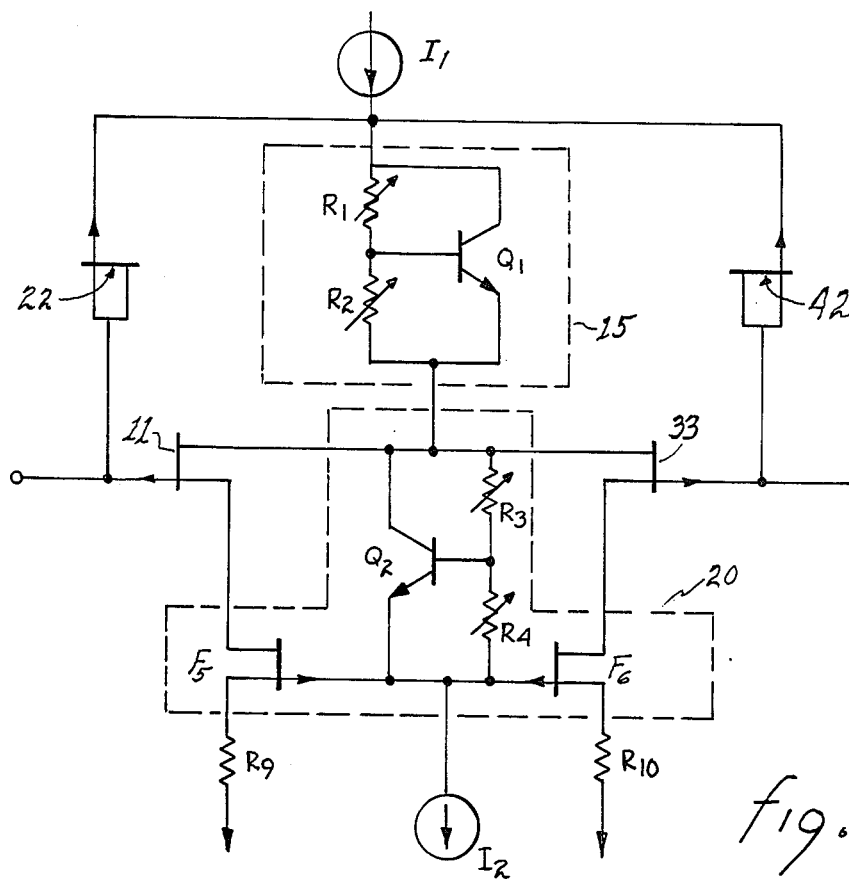
FIG. 4 is a circuit diagram illustrating implementations of gate bias current compensating circuits of FIG. 2.

Referring now to FIG. 1, there is shown schematically an illustrative embodiment of the present invention. The circuit of FIG. 1 includes a junction field effect (JFET) transistor device 1 of any desired polarity. A temperature and voltage sensitive compensation means, a second JFET 2 is coupled to the JFET device 1 as shown. Variable resistance networks 4 and 6 are connected, as shown, for adjusting the voltages the gate of the compensation JFET 2 and the drain of the input JFET 1.

In the embodiment of FIG. 1, the input JFET 1 has a gate current sensitive to both temperature and the drain-gate reverse voltage. The compensation JFET 2 is desirably a second input JFET similar or identical to the input JFET 1 in order to achieve best temperature tracking of the compensation current and the gate current. In this case, the compensation JFET has its source and drain connected together and to the gate of the device 1. Since the leakage current in both the input JFET 1 and compensation JFET 2 increases with voltage (as well as temperature) the trimmable voltage control means 4 and 6 may be adjusted for best compensation.

The method for compensation trimming is explained by reference to FIG. 3. Even though the compensation JFET 2 and the input JFET 1 are preferably selected to have similar leakage currents, the input bias current prior to trim (see the upper linear curve) is nearly 10 pA at 25° and increases to over 10 nanoamperes at 150° C. At room temperature, the input bias current to the input JFET 1 is so low that it is extremely difficult to measure on a production basis (e.g. wafer probe) with sufficient accuracy to enable appropriate trimming. By placing the circuit combination on, for example, a hot chuck, and elevating the temperature to say 150° C., the measured input bias current becomes much less sensitive to stray signals and accurate trimming can be achieved, at least to a value again determined by noise. For example, the input bias current can be trimmed by adjustment of the variable resistance networks 4 and 6 from about 25 nanoamperes to about 100 picoamperes at 150° C.

This exemplary 250 times differential is maintained over the temperature range of FIG. 3, so that the 25° C. input bias current is reduced to about 20 femptoamperes. The practical limitation on the reduction is the resolution and accuracy of the high temperature current mensuration, and thus the compensation is improved by measuring at the highest temperature consistent with other considerations.

FIG. 2 shows an analogous schematic circuit for the case of junction field effect devices 11 and 33 suitable as differential elements (such as for use in a differential amplifier). Two current compensation JFETs 22 and 42 which can have different leakage currents provide individual leakage compensation for the JFET devices 11 and 33, respectively, by adjustment from dual variable resistance networks 44 and 66 (which are similar to the network 4 and 6 of FIG. 1). The network 66 may include, for example, load means for the JFETs 11 and 33, and may be separately adjusted to compensate for differences in the characteristics of the JFETs 11 and 33 at elevated temperatures prior to the final leakage current compensation trim by adjustment of the dual variable resistance network 44 (which is adjustable like the means 4).

Referring next to FIG. 4, a schematic circuit diagram of the variable resistance networks 44 and 66 of FIG. 2 are shown. Current source $I_1$ is coupled to a gate of field effect transistor 22, to a first terminal of variable resistor $R_1$, a collector terminal of NPN transistor $Q_1$ and to gate terminal of field effect transistor 42. A second terminal of variable resistor $R_1$ is coupled to a base terminal of transistor $Q_2$ and to a first terminal of variable resistor $R_2$. A second terminal of variable resistor R$_2$ is coupled to an emitter of transistor Q$_1$, to a source terminal of field effect transistor 11, to a source terminal of field effect transistor 33, to a first terminal of variable resistor R$_3$ and to collector terminal of NPN transistor Q$_2$. A second terminal of variable resistor R$_3$ is coupled to a base terminal of transistor Q$_2$ and to a first terminal of variable resistor R$_4$. A second terminal of variable resistor R$_4$ is coupled to an emitter terminal of transistor Q$_2$, to a gate terminal of field effect transistor F$_5$, to a gate terminal of field effect transistor F$_6$ and to current source I$_2$. The drain circuit of transistor F$_5$ is coupled to one terminal of resistor R$_4$, while a drain terminal of transistor F$_6$ is coupled to one terminal of resistor R$_{10}$. A source terminal of transistor F$_5$ is coupled to a drain terminal of transistor 11, while a source terminal of transistor F$_6$ is coupled to a drain terminal of transistor 33. A gate terminal of transistor 11 is coupled to a signal input terminal and to a drain and a source terminal of transistor 22, while a gate terminal of transistor 33 is coupled to a source of a drain terminal of transistor 42. The group of elements labelled 15 corresponds to the group of elements labelled Trimmable Voltage Control 44 in FIG. 2, while the group of elements labelled 20 corresponds to the group of elements labelled Trimmable Voltage Control 66 in FIG. 2.

Figure 5:
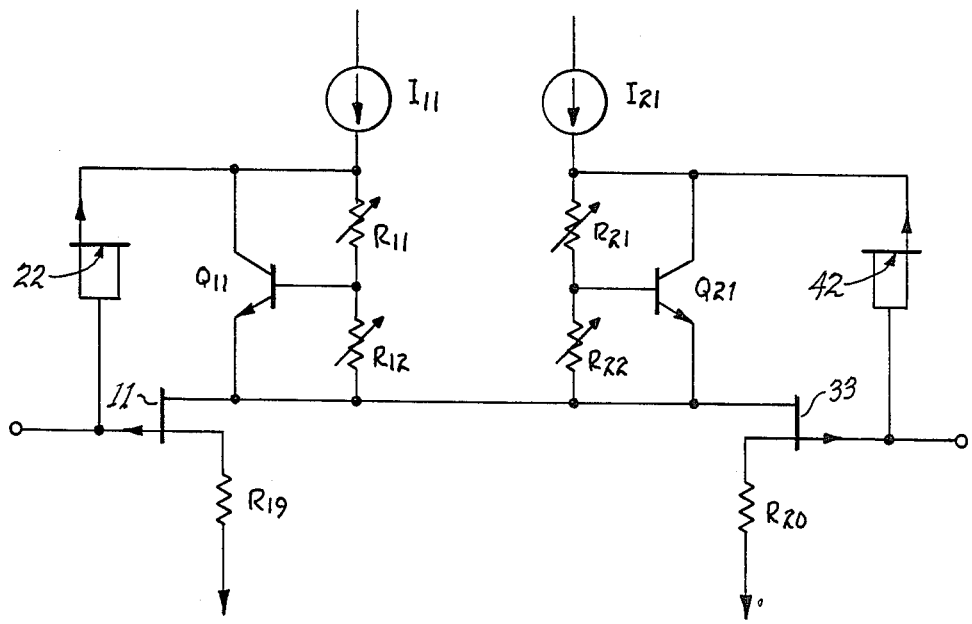
FIG. 5 is a circuit diagram for independently providing gate bias current compensation for input transistors.

Referring next to FIG. 5, a gate terminal field effect transistor 22 is coupled to current source I$_{11}$, to a first terminal variable resistor R$_{11}$, and to a collector terminal of NPN transistor Q$_{11}$. A second terminal of variable resistor R$_{11}$ is coupled to a base terminal of transistor Q$_{11}$ and to a first terminal of variable resistor R$_{12}$. A second terminal of resistor R$_{12}$ is coupled to source terminal of field effect transistor 11, an emitter terminal of transistor Q$_{11}$, a second terminal of variable resistor R$_{22}$, an emitter terminal of NPN transistor Q$_2$, and to a source terminal of field effect transistor 33. Current source I$_{21}$ is coupled to a first terminal of variable resistor R$_{21}$, to a collector terminal of transistor Q$_{21}$ and to a gate terminal of field effect transistor 42. A second terminal of variable resistor R$_{21}$ is coupled to a base terminal of transistor Q$_{21}$ and to a first terminal of variable resistor R$_{22}$. A gate terminal of transistor 11 is coupled to an input terminal, and to a drain terminal of transistor 22, while a drain terminal of transistor 11 is coupled to one terminal of resistor R$_{19}$. A gate terminal of transistor 33 is coupled to a second input terminal, a source terminal of transistor 42 and a drain terminal of transistor 42, while a drain terminal of transistor 33 is connected to one terminal of resistor R$_{20}$.

The apparatus and methods described hereinbefore are applicable to other semiconductor devices whose leakage may appreciably affect circuit performance. For example, in a bipolar transistor, the collector-base leakage current is multiplied by the current gain and causes undesirable stray signals at high temperature. Compensation of leakage currents in semiconductors over a wide temperature range may be achieved by precise trimming at a single high temperature. The method is generally applicable anytime a temperature-sensitive circuit current results in an undesired or stray signal at high temperatures.

Referring once again to FIG. 4, the variable resistance element R$_1$, R$_2$, R$_3$ and R$_4$ can be trimmable resistor elements. In most applications, only one of circuit 15 or circuit 20 would be employed. The circuit combination of Q$_1$, R$_1$ and R$_2$ can be used to generate voltage from approximately one V$_{be}$ (i.e. the voltage between the base and the emitter) to several multiple of V$_{be}$. The operation of the circuit can be understood in the following manner. Assume that the current flowing through R$_1$ is the same as the current flowing through R$_2$ and that the voltage drop across R$_2$ is the same as V$_{be}$ of Q$_1$. The voltage drop across R$_1$ is then V$_{be}$ (R$_1$/R$_2$). The total voltage between the collector and emitter of Q$_1$ is therefore V$_{be}$ (1+R$_1$/R$_2$). By increasing (i.e. by trimming) R$_1$, the total voltage (V$_{ce}$ of Q$_1$) increases and by increasing (i.e. by trimming) R$_2$, the total voltage decreases. Because the gate source voltage of the JFET transistor 11 is relatively constant as a result of the constant source current, the voltage across transistor 22 and transistor 42 is a direct function of V$_{ce}$ of Q$_1$. By increasing or decreasing the voltage across transistor 22 and transistor 11, the leakage currents through the devices are altered, adjusting to the input gates of transistor 11 and transistor 33. These currents compensate for the gate current of the input transistors.

The trimmable control network 66 from FIG. 2 consists of transistor Q$_2$, resistors R$_3$ and R$_4$ as well as cascade transistors F$_5$ and F$_6$. The cascade transistors are shown as junction field effect transistors (JFETs), but this circuit can be implemented with bipolar transistors or with metal-oxide semiconductor field effect transistors (MOSFETs). The current source I$_2$ provides a sink for less current than is supplied by current source I$_1$. The transistor Q$_2$ and resistors R$_3$ and R$_4$ can provide a multiplication of the V$_{be}$ voltage drop. Because the gate leakage current of a JFET transistor is a direct function of the source-drain voltage of the JFET transistor, the leakage current can be matched to the compensation current by increasing or decreasing the voltage drop across the collector-emitter terminals of transistors Q$_2$. As indicated above, circuit 15 and circuit 20 are typically not used together so when circuit 20 is in use only current source I$_2$ need be present in the circuit and transistor Q$_1$ and resistor R$_1$ and R$_2$ need not be present. The same result can be accomplished for one input device by removing transistor 42, transistor 33, transistor F$_6$ and resistor R$_{10}$ for the circuit shown in FIG. 4. The resulting circuit provides an implementation of circuit shown in FIG. 1.

If separate bias control is desirable the circuit shown in FIG. 5 can be employed by adjusting (trimming) R$_{11}$ or R$_{12}$, the input bias current compensation for transistor 11 can be provided. By adjusting resistors R$_{21}$ or R$_{22}$, the input bias current compensation for transistor 33 is provided.

Similarly, separate compensation circuit can perform the same function as shown in circuit 20 of FIG. 4.

The disclosed method for compensation is also especially applicable whenever any two currents which increase with temperature must track accurately over a broad temperature range; the desired ration of currents may be other than one-on-one as in the case of leakage current compensation described hereinbefore.

While the invention has been particularly described and shown in reference to the preferred embodiments thereof, it will be understood by those skilled in the art that various changes in form and detail and omissions may be made therein without departing from the spirit and scope of the invention.

What is claimed is:

1. A semiconductor circuit provided with input and output terminal for operation over a range of temperatures, comprising, in combination:
   a first semiconductor device provided with at least a first, second and third main terminals and having a low room temperature leakage current and a larger higher temperature leakage current;

a semiconductor device means provided with a first, second and third main terminals and having temperature sensitive leakage current characteristics similar to said first semiconductor device and electrically connected to said first semiconductor device at a junction between a common point of said second and third main terminals of said semiconductor device means and said first main terminal of said first semiconductor device to supply at least a portion of the leakage current of said first semiconductor device; and at least one variable zener means electrically connected to said second main terminal of said first semiconductor device and to said first main terminal of said semiconductor device means and adjusted at a higher temperature than room temperature for substantially matching the leakage current of said first semiconductor device and said semiconductor device means.

2. The circuit of claim 1 further including a second trimmable resistance network voltage means which includes a variable zener electrically connected between said second and third main terminals of said first semiconductor device and adjusted at a higher temperature than room temperature for matching the leakage of said first semiconductor device and said semiconductor device means.

3. The circuit of claim 1 or claim 2 wherein: said first semiconductor device and said semiconductor device means comprise a junction field effect transistors.

4. A semiconductor circuit provided with input and output terminals for operation over a range of temperatures, comprising in combination:

a first JFET provided with a first, second and third main terminals, having a low room temperature leakage current and a larger temperature leakage current;

a second JFET also provided with a first, second and third main terminals, for compensation purposes having temperature sensitive leakage current characteristics similar to said first JFET, said second JFET being electrically connected to said first main terminal of said first JFET at said second JFET's commoned second and third main terminals to supply at least a portion of the leakage current of said first JFET;

a variable zener electrically connected to said first main terminal of said second JFET and to said second main terminal of said first JFET and adjusted at a higher temperature than room temperature for substantially matching the leakage current of said first JFET and said second JFET; and a second variable resistance network which includes a variable zener electrically connected between said second and third main terminal of said first JFET and adjusted at a higher temperature than room temperature for matching the leakage current of said first JFET and said second JFET.

5. A semiconductor circuit provided with input and output terminals for operation as a differential amplifier with low input bias current over a wide range of temperatures, comprising, in combination:

first and second semiconductor device gain elements, each provided with their respective first, second and third main terminals, having low room temperature input leakage currents and larger higher temperature input leakage currents;

first and second semiconductor device means, each provided with their respective first, second and third main terminals, having temperature sensitive leakage current characteristics similar to said first and second semiconductor devices, each of said first and second semiconductor device means having a commoned second and third main terminals electrically connected, respectively, to said first main terminals of said first and second semiconductor devices to supply at least a portion of the input leakage currents of said first and second semiconductor devices; and at least one variable zener means electrically connected to each of said first main terminals of said first and second semiconductor device means and to each of said second main terminals of said first and second semiconductor devices, said variable zener means adjusted at a higher than room temperature to substantially match the leakage currents of both of said semiconductor devices and both of said semiconductor device means to reduce the difference in the input leakage current of said first and second semiconductor devices over a range of temperatures.

6. The circuit of claim 5 including a second trimmable resistance network type voltage means which includes a variable zener electrically connected between each of said second and third main terminals of said first and second semiconductor devices and adjusted at said higher temperature to reduce the effective input bias current to said first and second semiconductor devices over a range of temperatures.

7. The circuit of claim 5 or claim 6 wherein: said first and second semiconductor devices and said first and second semiconductor device means comprise junction field effect transistors.

8. A semiconductor circuit provided with input and output terminals for operation as a differential amplifier with a low input bias current over a wide range of temperature, comprising, in combination:

first and second JFETs used as gain elements, each provided with a first, second and third main terminals, having low temperature input leakage currents and larger higher temperature input leakage currents;

third and fourth JFETs used for current compensation, each also provided with a first, second and third main terminals, having temperate sensitive leakage current characteristics similar to said first and second JFETs, said third and fourth JFETs each being electrically connected, at their commoned said second and third main terminals, respectively, to each of said first main terminals of said first and second JFETs, to supply at least a portion of the input leakage currents of said first and second JFETs; and a variable zener electrically connected to each of said first main terminals of said third and fourth JFETs and to each of said second main terminals of said first and second JFETs, said variable zener adjusted at higher than room temperature to substantially match the leakage currents of both of said first and second JFETs and both of said third and fourth JFETs to reduce the difference in the input leakage currents of said first and second JFETs over a range of temperatures.

9. A semiconductor circuit provided with input and output terminals for operation as a differential amplifier with a low input bias current over a wide range of temperature, comprising, in combination:
- a first and second JFETs used as gain elements, each provided with a first, second and third main terminals, having low temperature input leakage currents and larger higher temperature input leakage currents;
- third and fourth JFETs used for current compensation, each also provided with a first, second and third main terminals, having temperate sensitive leakage current characteristics similar to said first and second JFETs, said third and fourth JFETs each being electrically connected, at their commoned said second and third main terminals, respectively, to each of said first main terminals of said first and second JFETs, to supply at least a portion of the input leakage currents of said first and second JFETs;
- a variable zener electrically connected to each of said first main terminals of said third and fourth JFETs and to each of said second main terminals of said first and second JFETs, said variable zener adjusted at higher than room temperature to substantially match the leakage currents of both of said first and second JFETs and both of said third and fourth JFETs to reduce the difference in the input leakage currents of said first and second JFETs over a range of temperatures; and
- a second variable resistance network which includes a variable zener electrically connected between each of said second main terminals and each of said third main terminals of said first and second JFETs, said variable resistance network adjusted at higher than room temperature to substantially match the leakage currents of said first and second JFETs to reduce the input leakage currents of said first and second JFETs over a range of temperatures.

10. A semiconductor circuit provided with input and output terminal for operation over a range of temperatures, comprising, in combination:
- a first semiconductor device provided with at least a first, second and third main terminals and having a low room temperature leakage current and a larger higher temperature leakage current;
- a semiconductor device means provided with a first, second and third main terminals and having temperature sensitive leakage current characteristics similar to said first semiconductor device and electrically connected to said first semiconductor device at a junction between a common point of said second and third main terminals of said semiconductor device means and said first main terminal of said first semiconductor device to supply at least a portion of the leakge current of said first semiconductor device; and
- at least one variable zener means electrically connected to said second main terminal of said first semiconductor device and to said first main terminal of said semiconductor device means and adjusted at a higher temperature than room temperature for reducing the leakage current of said first semiconductor device over a range of temperatures.

11. The circuit of claim 10 further including a second trimmable resistance network voltage means which includes a variable zener electrically connected between said second and third main terminals of said first semiconductor device and adjusted at a higher temperature than room temperature for reducing the effective leakage current of said first semiconductor device over a range of temperatures.

12. The circuit of claim 10 or claim 11 wherein: said first semiconductor device and said semiconductor device means comprise a junction field effect transistors.

13. A semiconductor circuit provided with input and output terminals for operation as a differential amplifier with low input bias current over a wide range of temperatures, comprising, in combination:
- first and second semiconductor device gain elements, each provided with their respective first, second and third main terminals, having low room temperature input leakage currents and larger higher temperature input leakage currents;
- first and second semiconductor device means, each provided with their respective first, second and third main terminals, having temperature sensitive leakage current characteristics similar to said first and second semiconductor devices, each of said first and second semiconductor device means having a commoned second and third main terminals electrically connected, respectively, to said first main terminals of said first and second semiconductor devices to supply at least a portion of the input leakage currents of said first and second semiconductor devices; and
- at least one variable zener means electrically connected to each of said first main terminals of said first and second semiconductor device means and to each of said second main terminals of said first and second semiconductor devices, said variable zener means adjusted at a higher than room temperature for reducing the difference in the input leakage currents of said first and second semiconductor devices over a range of temperatures.

14. The circuit of claim 13 including a second trimmable resistance network type voltage means which includes a variable zener electrically connected between each of said second and third main terminals of said first and second semiconductor devices and adjusted at said higher temperature for reducing the effective input bias current of said first and second semiconductor devices over a range of temperatures.

15. The circuit of claim 13 or claim 14 wherein: said first and second semiconductor devices and said first and second semiconductor device means comprise junction field effect transistors.

16. A method for reducing the effective leakage current of a first semiconductor device provided with a first, second and third main terminals over a broad range of temperatures comprising the steps of:
- electrically connecting a semiconductor device means provides with a first, second and third main terminals having, said second and third main terminals electrically commoned and thereat connected to said first main terminal of said first semiconductor device, said semiconductor device means having temperature sensitive leakage currents similar to said first semiconductor device to supply at least a portion of the leakage current of said first semiconductor device;

placing said first semiconductor device and said semiconductor device means in a temperature chamber means;

elevating the temperature of said temperature chamber means until the measured input bias current of said first semiconductor device becomes much less sensitive to stray signals than said first semiconductor device is at ambient temperatures; and adjusting a variable zener to reduce the effective leakage current of said first semiconductor device over said broad range of temperatures, said variable zener being electrically connected between said first main terminal of said semiconductor device means and said second main terminal of said first semiconductor device.

17. The method of claim 16 further including the step of:

adjusting a second variable resistance network which includes a variable zener electrically connected between said second and third main terminal of said first semiconductor device at said higher temperature to reduce the effective leakage current of said first semiconductor device over said broad range of temperatures.

18. The method of claims 16 or claim 17 wherein said first semiconductor device and said semiconductor device means each comprise a junction field effect transistor.

19. A method for reducing the effective leakage current of a first JFET provided with a first, second and third main terminals over a broad range of temperatures comprising the steps of:

electrically connecting a second JFET provided with a first, second and third main terminals having, said second and third main terminals electrically commoned and thereat connected to said first main terminal of said first JFET, said second JFET having temperature sensitive leakage currents similar to said first JFET to supply at least a portion of the leakage current of said first JFET;

placing said first JFET and said second JFET in a temperature chamber means;

elevating the temperature of said temperature chamber means until the measured input bias current of said first JFET becomes much less sensitive to stray signals than said first JFET is at ambient temperatures;

adjusting a variable zener to reduce the effective leakage current of said first JFET over said broad range of temperatures, said variable zener being electrically connected between said first main terminal of said second JFET and said second main terminal of said first JFET; and adjusting a second variable resistance network which includes a variable zener electrically connected between said second and third main terminal of said first JFET at said higher temperature to reduce the effective leakage current of said first JFET over said broad range of temperatures.

20. A method for achieving an accurate temperature tracking ratio of two semiconductor device currents which increase with temperature, comprising the steps of:

providing at least one variable zener means for adjusting at least one of said semiconductor device currents; and trimming said variable zener means at a higher temperature than room temperature to achieve the desired ratio of the two currents.

* * * * *